(12) United States Patent
Bruno et al.

(10) Patent No.: US 6,500,688 B2
(45) Date of Patent: Dec. 31, 2002

(54) INTERBAND CASCADE LIGHT EMITTING DEVICE AND METHOD OF MAKING SAME

(75) Inventors: John D. Bruno, Bowie, MD (US); John T. Pham, Fairfax, VA (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 42 days.

(21) Appl. No.: 09/805,724

(22) Filed: Mar. 14, 2001

(65) Prior Publication Data

US 2002/0131463 A1 Sep. 19, 2002

(51) Int. Cl.[7] ............................................. H01L 21/00
(52) U.S. Cl. ............................ 438/39; 438/34; 438/35; 438/46; 372/4; 372/23; 372/43; 372/44; 372/45; 372/46; 257/14; 257/22
(58) Field of Search .......................... 438/34, 35, 39, 438/46; 372/41, 43, 44, 45, 23, 46; 257/141, 22

Primary Examiner—Long Pham
(74) Attorney, Agent, or Firm—Paul S. Clohan, Jr.; Edward L. Stolarun

(57) ABSTRACT

An interband cascade (IC) light emitting device having narrow ridges, and a method of growing and fabricating the IC light emitting device is disclosed. The IC light emitting device produced by the method of the present invention has 18 active regions separated by n-type injection regions and a plurality of coupled quantum wells of Al(In)Sb, InAs, and Ga(In)Sb layers. The IC light emitting device produced according to the present method has a differential external quantum efficiency of at least 500%, a peak power output of at least 4W/facet, a power conversion efficiency of at least 14% in continuous wave at 80K, a power conversion efficiency of at least 18% in pulsed wave operation at 80K, a continuous wave operation temperature of 142 K or less, a thermal resistance of from about 24–29 $K*cm^2/kW$ and continuous wave output powers of at least 100 mW/facet at temperatures above 77K.

9 Claims, 12 Drawing Sheets

1

INTERBAND CASCADE LIGHT EMITTING DEVICE AND METHOD OF MAKING SAME

FIELD OF THE INVENTION

The invention relates to a new, efficient type-II interband cascade light emitting device and a method of making same. More particularly, this invention relates to a new, novel method of fabricating interband cascade light emitting. Devices made in this manner have record-high differential external quantum efficiencies, high peak output power and high power conversion efficiencies.

BACKGROUND OF THE INVENTION

Compact, reliable mid-infrared (IR) (wavelength$\lambda$>2.5 $\mu$m, frequency v<120 THz) light sources are required for many civilian and military such as chemical sensing, IR communications, infrared countermeasures (IRCM), IR illumination, laser surgery, industrial process control, and IR lidar for aircraft and automobiles. If efficient semiconductor diode lasers were available for the mid-IR wavelength range, they would offer considerable advantages in terms of cost, volume, weight, simplicity of system design, reliability, and overall performance over presently available IR sources. Requirements for such lasers include a relatively high output power and operation either at ambient temperature or at temperatures accessible with thermoelectric (TE) coolers.

Three narrow band-gap material systems, i.e. the IV—VI lead salts, the II–VI ternary alloys, and the Sb-based III–V compounds, have been used as conventional interband transition approaches to mid-IR lasers. However, the poor qualities of these narrow band-gap materials and some inherent mechanisms have limited their performance. Generally, the small photon energy $E_p$ (hv<0.5 eV) in the mid-IR spectral range is the cause of the inherent difficulties in obtaining high powers and in efficiently using applied voltage in conventional interband laser structures.

In 1994, a Bell Labs-Lucent team a quantum cascade (QC) laser, based on intersubband transitions in artificial semiconductor quantum-well (QW) structures, that has paved a new way toward high-power mid-IR light sources. The design had two major advantages over earlier longer wavelength diode lasers. First, its structure could be designed, in principle, to emit at any wavelength longer than about 5 $\mu$m. Second, because it consisted of a unipolar active region, active layers could be stacked in series allowing for devices with higher quantum efficiencies. This means that after achieving lasing, each additional electron injected into the device could produce more than one photon; ideally, one photon for each active layer in the structure.

Intersubband QC lasers have relatively high threshold current densities (typically<1 kA/cm$^2$) due to very fast phonon relaxation inherent to intersubband transitions, resulting in significant heating and subsequent limitations on power conversion (wall-plug) efficiency. Thus, it is very challenging for intersubband lasers to achieve continuous-wave (cw) operation and high average power at room temperature (the cw power efficiencies for such QC lasers have been reported in the literature as less than 9%, even at cryogenic temperatures). For applications such as IRCM that require high power constrained with specific size, weight, and power consumption limitations, power efficiency becomes the crucial figure of merit of the laser.

Interband cascade (IC) lasers, which utilize optical transitions between the conduction and valence bands in a staircase of Sb-based type-II quantum well (QW) structures, reuse injected electrons by taking advantage of the broken band-gap alignment in Sb-based type-II QWs to form cascade stages, leading to a quantum efficiency greater than the conventional limit of unity, similar to the intersubband QC laser. Such IC laser designs can circumvent the fast phonon scattering loss in intersubband QC lasers and suppress Auger recombination through band-structure engineering. Mid-IR IC lasers based on InAs/GaInSb type-II QWs are promising for obtaining high output powers.

SUMMARY OF THE INVENTION

It is an object of the present invention to provide an interband cascade (IC) light-emitting device capable of delivering high output powers and relatively high operating temperatures for use in a wide range of applications, while operating efficiently, as discussed above.

It is a further object of the present invention to provide a reliable and reproducible method of manufacturing a laser (light emitting device) having the above characteristics.

In order to achieve the above objects of the present invention, a first embodiment of the invention is provided consisting of a method of manufacturing an IC emitting device comprising the steps of (a) growing a laser sample from Al(In)Sb, InAs, and Ga(In)Sb layers having a top, bottom and cavity using a solid source molecular beam epitaxy (MBE) system on a (001)-oriented p-type GaSb substrate; (b) processing the laser sample into mesa-stripes having widths of from 35–215 $\mu$m and about 500 $\mu$m center-to-center separations between mesas using etching to form an etched sample;(c) depositing about 250 $\mu$m thick SiO$_2$ layer on the etched sample; (d) removing the 250 $\mu$m thick SiO$_2$ layer on top of the mesas to allow deposition of metal contacts to top device layers; (e) depositing Au/Ni/AuGe metal contact layers having a thickness of about 300 $\mu$m and a width of about 250 $\mu$m on the top of the sample to form a contact or bonding pad; (f) lapping and polishing the bottom of the laser sample down to about 100 $\mu$m; (g) depositing a Ti/Au metal contact layer having a thickness of about 350 $\mu$m on the bottom of the sample; (h) cleaving one or more laser bars having an epilayer and both facets left uncoated to the cavity of the laser sample; and (i) mounting the laser bars, epilayer side up, onto a second substrate to form the laser device.

A second embodiment is further provided consisting of a method of manufacturing an interband cascade light emitting device comprising the steps of (a) growing a laser sample having a top, bottom and cavity in a solid source molecular beam epitaxy (UBE) system on a (001)-oriented p-type GaSb substrate;(b) processing the laser sample into mesa-stripes having widths of from 35–215 $\mu$m and about 500 $\mu$m center-to-center separations between mesas using etching to form an etched sample; (c) depositing about 250 $\mu$m thick SiO$_2$ layer on the etched sample; (d) removing the 250 $\mu$m thick SiO$_2$ layer on top of the mesas to allow deposition of metal contacts onto the top device layers; (e) depositing Au/Ni/AuGe metal contact layers having a thickness of about 300 $\mu$m and a width of about 250 $\mu$m on the top of the laser sample to form a contact or bonding pad; (f) lapping and polishing the bottom of the laser sample down to about 100 $\mu$m; (g) depositing a Ti/Au metal contact layer having a thickness of about 350 $\mu$m on the bottom of the sample;(h) cleaving one or more laser bars having an epilayer and both facets left uncoated to the cavity of the laser sample; and (i) mounting the laser bars, epilayer side up, onto a second substrate. The IC light emitting device manufactured according to the process of the second embodiment is comprised of 18 active regions separated by n-type injection regions and a plurality of coupled quantum wells of Al(In)Sb, InAs, and Ga(In)Sb layers, and has a differential external quantum efficiency of at least 500%, a peak power output of at least 4W/facet, a power conversion efficiency of at least 14% in continuous wave at 80K, a power conversion efficiency of at least 18% in pulsed wave operation at 80K, a continuous wave operation temperature of 142K or less, a thermal resistance of from about 24–29 $K*cm^2/kW$ and continuous wave output powers of at least 100 mW/facet at temperatures above 77K.

In a third embodiment of the present invention according to the first embodiment above, the etching step (b) is performed using wet chemical etching and/or dry-etching techniques.

In a fourth embodiment of the present invention according to the second embodiment above, the deposition step (c) of a 250 $\mu$m thick layer of $SiO_2$ on the etched sample is performed using plasma enhanced chemical vapor deposition.

In a fifth embodiment of the present invention according to the third embodiment above, the deposition step (d) of Au/Ni/AuGe is performed using photolithography and/or lift-off techniques.

In a sixth embodiment of the present invention according to the fourth embodiment above, the second substrate is comprised of a metal.

In a seventh embodiment of the present invention according to the fourth embodiment above, the second substrate is a metal sheet.

In an eighth embodiment of the present invention according to the seventh embodiment above, the metal sheet is a thin copper sheet.

In a ninth embodiment of the present invention, an interband cascade light emitting device manufactured according to the method of the eighth embodiment above is provided, wherein the continuous output power of the device is at least 100 mW/facet at temperatures above 77K.

In a tenth embodiment of the present invention, an interband cascade light emitting device with lasing wavelengths of from about 3.6–3.8 $\mu$m is provided, having 18 active regions separated by n-type injection regions and a plurality of quantum wells made of Al(In)Sb, InAs, and Ga(In)Sb layers.

In an eleventh embodiment of the present invention, an interband cascade light emitting device is provided according to the ninth embodiment above, further having a differential external quantum efficiency of at least 500%.

In a twelfth embodiment of the present invention according to the eleventh embodiment above, an IC light emitting device is provided having a peak power output of at least 4W/facet.

In a thirteenth embodiment of the present invention according to the twelfth embodiment above, an IC light emitting device is provided having a power conversion efficiency of at least 14% in continuous wave at 80K, and a power conversion efficiency of at least 18% in pulsed wave operation at 80K.

In a fourteenth embodiment of the present invention according to the thirteenth embodiment above, an IC light emitting device is provided having a continuous wave operation temperature of 142K or less.

In a fifteenth embodiment of the present invention according to the fourteenth embodiment above, an IC light emitting device is provided having a thermal resistance of from about 24–29 $K*cm^2/kW$.

In a sixteenth embodiment of the present invention according to the fifteenth embodiment above, an IC light emitting device is provided having continuous wave output powers of at least 100 mW/facet at temperatures above 77K.

In a seventeenth embodiment of the present invention, a method of manufacturing an interband cascade light-emitting device is provided comprising the steps of (a) growing a laser sample made from Al(In)Sb, InAs, and Ga(In)Sb layers having a top, bottom and cavity; (b) processing said laser sample into mesa-stripes having widths of from 35–215 $\mu$m and about 500 $\mu$m center-to-center separations between mesas using etching to form an etched sample; (c) deposition of an about 250 $\mu$m thick $SiO_2$ layer on said etched sample; (d) removal of the 250 $\mu$m thick $SiO_2$ layer on top of said mesas to allow deposition of metal contacts to top device layers; (e) deposition of Au/Ni/AuGe metal contact layers having a thickness of about 300 $\mu$m and a width of about 250 $\mu$m on the top of said sample to form a contact or bonding pad; (f) lapping and polishing of the bottom of said laser sample down to about 100 $\mu$m; (g) deposition of a Ti/Au metal contact layer having a thickness of about 350 $\mu$m on the bottom of said sample; (h) cleavage of one or more laser bars having an epilayer and both facets left uncoated to said cavity of said sample; and (i) mounting of said laser bars, epilayer side up, onto a second substrate to form said device.

DETAILED DESCRIPTION OF THE INVENTION

Figure 1:
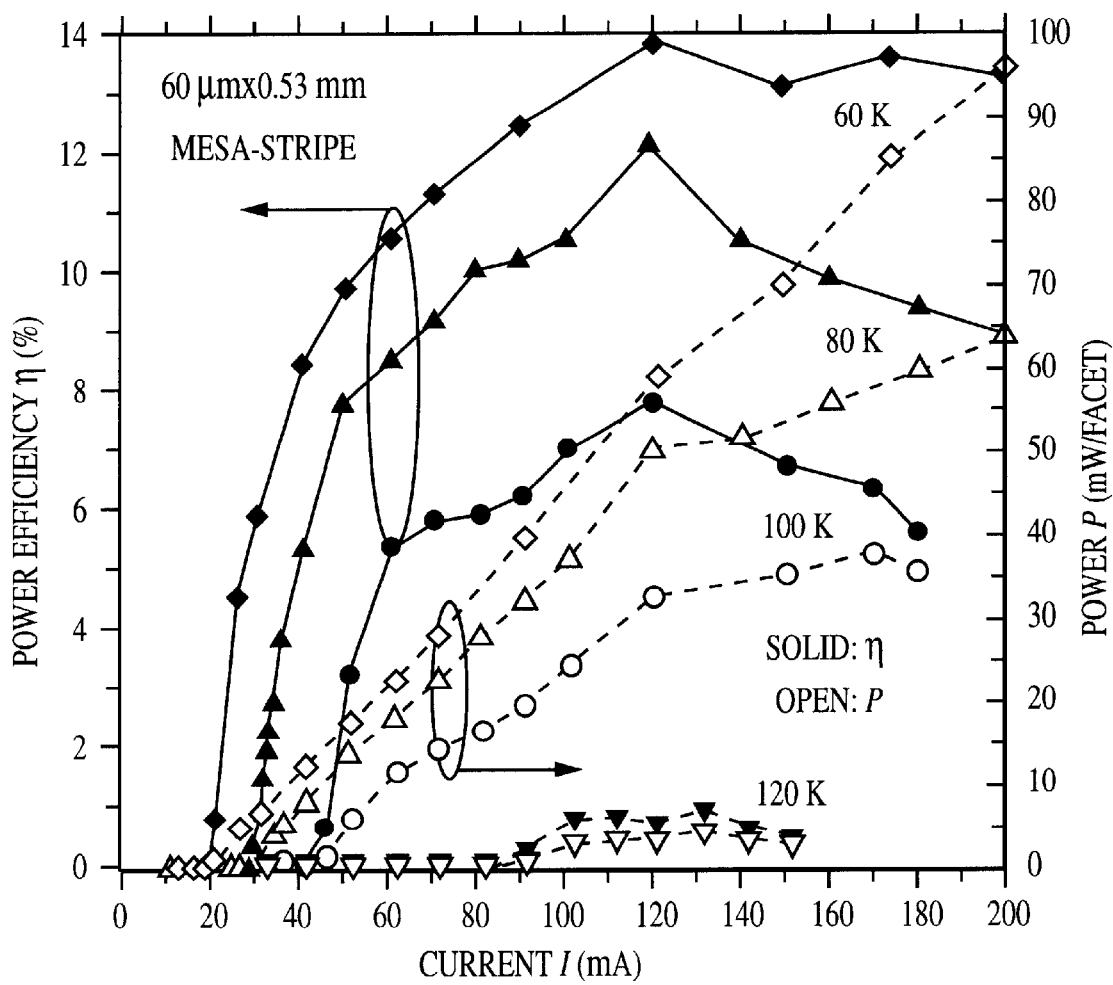
FIG. 1 is a graph illustrating current versus both power efficiency and power output at several different temperatures for a 0.53 mm-long and 60-$\mu$m-wide deep-wet-etched mesa-stripe laser manufactured according to the method of the present invention.

The IC light emitting device of the ninth embodiment of the present invention, manufactured according to the first embodiment of the present invention, consists of 18 active regions separated by n-type injection regions, has a top, a bottom and a cavity, and is composed of a plurality of coupled quantum wells (QWs) made from Al(In)Sb, InAs, and Ga(In)Sb layers. The laser sample (IC light emitting device) is grown in a solid source molecular beam epitaxy (MBE) system on a (001)-oriented p-type GaSb substrate. However, the laser sample may be fabricated using known methods in the art other than MBE, such as MOCVD, so long as the method provides the desired characteristics.

In the MBE growth chamber, which is kept at a very low pressure (a high vacuum obtained by pumping the chamber with high vacuum pumps), the constituent elements of Al(In)Sb, InAs, and Ga(In)Sb (hereinafter the QW materials) are separately contained in heated effusion cells having exit openings and shutters which block the exit openings of these cells (8 cells were used in the growth chamber of the present invention), and are heated by electric coils of one or more electric furnaces. These cells are heated to sufficient temperatures so as to vaporize the QW materials, and the shutters are then opened at predetermined intervals and for predetermined time periods. The cell openings are configured so that the molecules that escape when the shutters are opened onto a thin wafer (referred to as the substrate), which may be for example silicon, gallium arsenide, gallium antimonide (as used herein), etc. This substrate is usually heated.

The molecules exiting their heated effusion cells when the shutters are opened (either manually or via computer control) strike the substrate surface, and many stick/accumulate thereon. If, for example, in an MBE chamber as used in the present invention, shutters for cells containing gallium and arsenic are both opened simultaneously, a layer of gallium arsenide "grows" epitaxially on the substrate surface. In this manner, one atomic layer at a time can be grown epitaxially on the substrate. The crystalline laser material described herein is grown in this manner.

After the growth, the sample is processed into mesa-stripes with several different widths (~35–215 $\mu$m) and 500 $\mu$m center-to-center separation between mesas preferably using dry-etching techniques. A 250-nm-thick $SiO_2$ layer is deposited on the etched sample preferably using plasma enhanced chemical vapor deposition.

Then, the $SiO_2$ layer on the top of the mesas is removed to allow the deposition of a metal contact onto the top device layer (the top layer of the IC light emitting device). Photolithography and lift-off techniques are preferably used to deposit Au/Ni/AuGe metal contact layers with a total thickness of ~300 nm onto the top of the device. The top metal layer is preferably about 250 $\mu$m wide and serves as a contact and a bonding pad for the device. The bottom of the device is lapped and polished down to ~100 $\mu$m, and then a 350-nm-thick Ti/Au layer is deposited as a metal contact layer. Laser bars are then cleaved to the cavity with both facets left uncoated. The laser bars are mounted, preferably epilayer side up, onto a metal substrate, such as a thin metal sheet of copper or the like, using indium solder. Measurements of the characteristics of the manufactured IC laser-emitting device may then be made.

It was unexpectedly discovered that in the IC light emitting device fabrication process/method of the present invention, when a $SiO_2$ layer is added on the device, extended metal contact layers could be easily deposited on the top of the device. These extended metal contact layers, in addition to other benefits, help wire bonding to narrow devices.

Furthermore, in comparison to previous IC light emitting devices having wider mesa-stripes, it was discovered that the IC light emitting devices manufactured according to the method of the present invention, which have relatively narrow mesa-stripes, are capable of unexpectedly high maximum continuous wave (cw) operation temperatures of up to 142K, and higher cw power efficiencies, e.g., ~18% at 60 K for a 35 $\mu$m-wide mesa-stripe laser. It is believed that the enhanced cw performance exhibited by the IC light emitting devices of the present invention may be attributable to the fact that heat accumulation in the active region of the devices is reduced due to relatively narrow mesa-stripes and smaller current. It is further believed that the $SiO_2$ and metal contact layers around the mesa-stripes act as a superior heat transfer agent, which serves to transfer and spread the heat better than air.

EXAMPLES

IC Light Emitting Devices of the Present Invention In Continuous Wave Mode

Several broad-area devices were manufactured according to the method of the present invention described above. These devices lased cw at temperatures up to ~110–128 K depending on their sizes. The lasing wavelengths ranged from ~3.66 to 3.73 $\mu$m, varying with the current and temperature, red shifting substantially with increasing device temperature. The observed cw threshold current density is smaller than 100 $mA/cm^2$ (as low as 56 $mA/cm^2$) for most devices at 80 K. FIG. 1 shows current-light (I-L) curves (current versus power efficiency and total output power for a 0.53 mm-long and 60-$\mu$m-wide deep-wet-etched mesa-stripe laser manufactured according to the method of the present invention. Optical output power of ~95 mW was observed from one facet of the device at 60 K and at a current of 200 mA, with an average differential external quantum efficiency (DEQE) exceeding 300%. From the data shown in FIG. 1, it is shown that a type-II IC light emitting device manufactured according to the method of the present invention delivers considerable power at a low current in contrast to other types of mid-IR diode lasers.

Combining a very efficient use of applied bias voltage in cascade structures, power efficiencies near 14% were obtained from this device at 60 to 80 K. For ~1-mm-long devices, the observed DEQEs and power efficiencies were typically ~70–80% of the values obtained from the ~0.5-mm-long devices, but comparable or higher output powers (>100 mW/facet at 80 K) were obtained at relatively large currents. Thus, it is shown that the performance of longer (~1.5-mm) devices is inferior to that of shorter devices due mainly to substantially increased losses from surface recombination and leakage. In addition, significant losses and nonuniformity-related fluctuations in longer mesa devices may be attributable to the devices being wet etched down to the substrate with uncontrolled rough surfaces.

However, for dry-etched devices that have relatively smooth surfaces, longer device (>1.5-mm) performance was also inferior to shorter device performance. This suggests that additional limiting factors may be present such as, for example, a non-optimum device package/inhomogeneous bonding related to mechanical stresses arising from substantially different thermal expansion coefficients between the devices and the Cu-submount. Nevertheless, compared to wet-etched devices, the dry-etched devices showed a somewhat improved performance, as described below.

Figure 2:
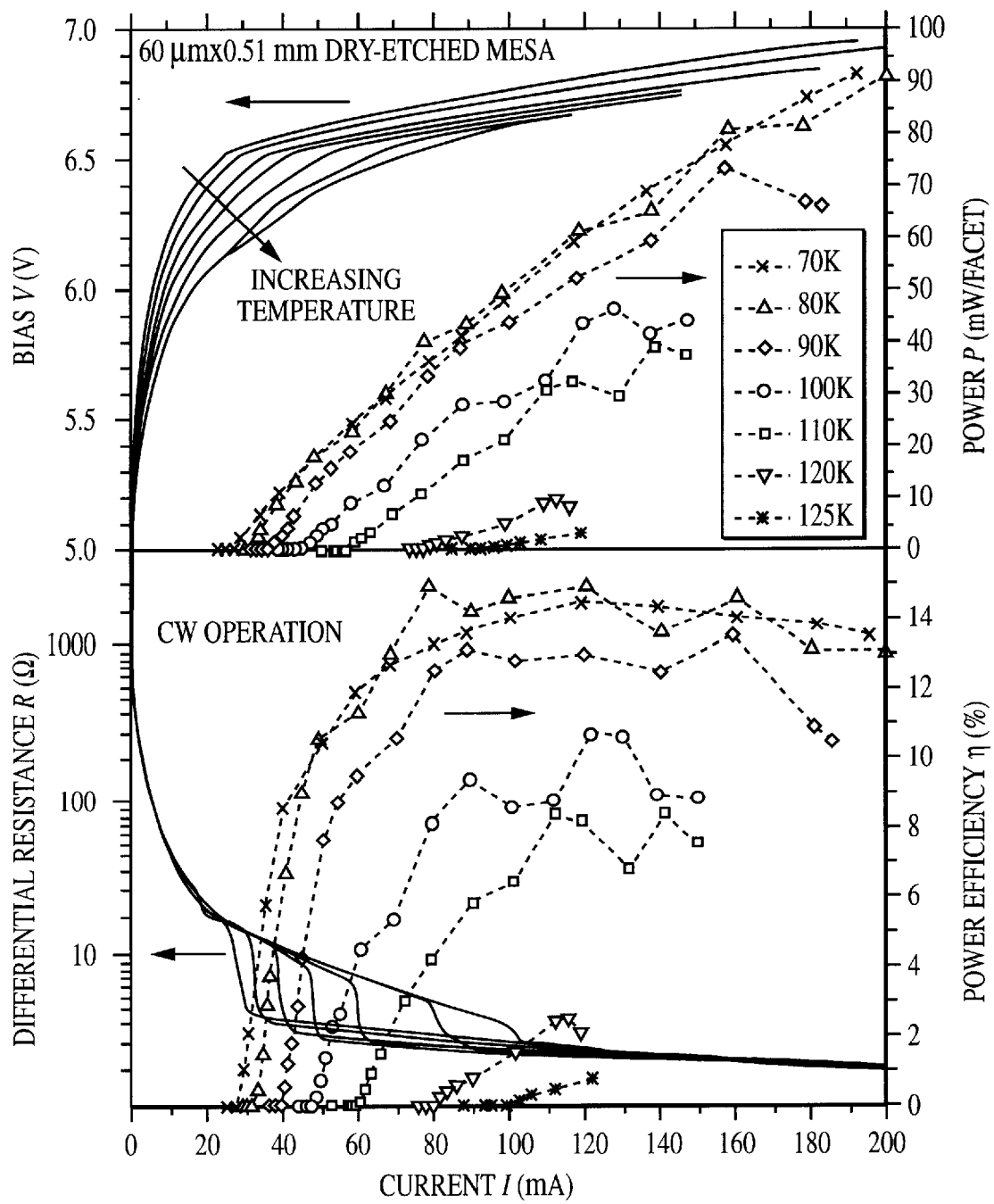
FIG. 2 is a graph illustrating the current-voltage-light (I-V-L) characteristics, differential resistance, and power efficiency of a 60-$\mu$m-wide dry-etched mesa-stripe laser of the present invention under cw conditions at heat sink temperatures ranging from 70 to 125 K.

FIG. 2 shows the I-V-L (current-bias-light) characteristics, differential resistance, and power efficiency of a 60-μm-wide dry-etched mesa-stripe IC light emitting device of the present invention under cw conditions at heat sink temperatures ranging from 70 to 125 K, which lased in cw mode up to 128 K.

As shown therein, the average DEQE for this 60-μm-wide dry-etched mesa-stripe light emitting device exceeds 300% at 70 and 80 K with an output power of ~90 mW/facet at a current of 200 mA. The differential resistance is initially very high (>10 kΩ, suggesting good material quality with insignificant leakage. The significant slope change observed on the I-V characteristic curve indicates an abrupt reduction of differential resistance at threshold, which clearly manifests a start-up of lasing action associated with a rapid increase in the pace of carrier transport around the threshold. Record-high power efficiencies (>14%) are obtained from this device at 70 and 80 K. For wider mesa-stripe devices, higher optical powers were observed, but the maximum cw operation temperatures were lower due to more heating of the devices from the larger currents needed compared to narrow-stripe (~60 μm) devices.

Figure 3:
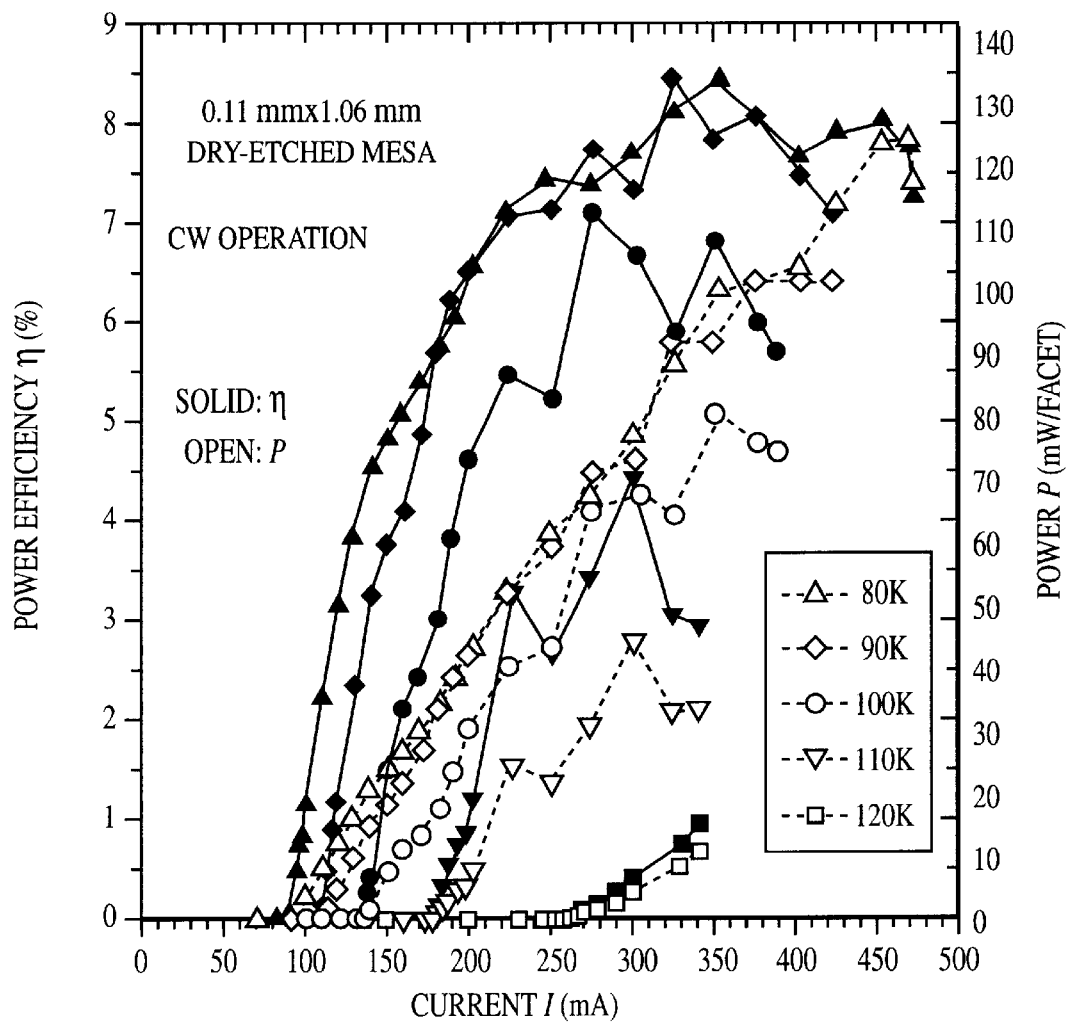
FIG. 3 is a graph of current versus output power and power efficiency of a 0.11-mm-wide and 1.06-mm-long dry-etched mesa-stripe laser of the present invention.
Figure 4:
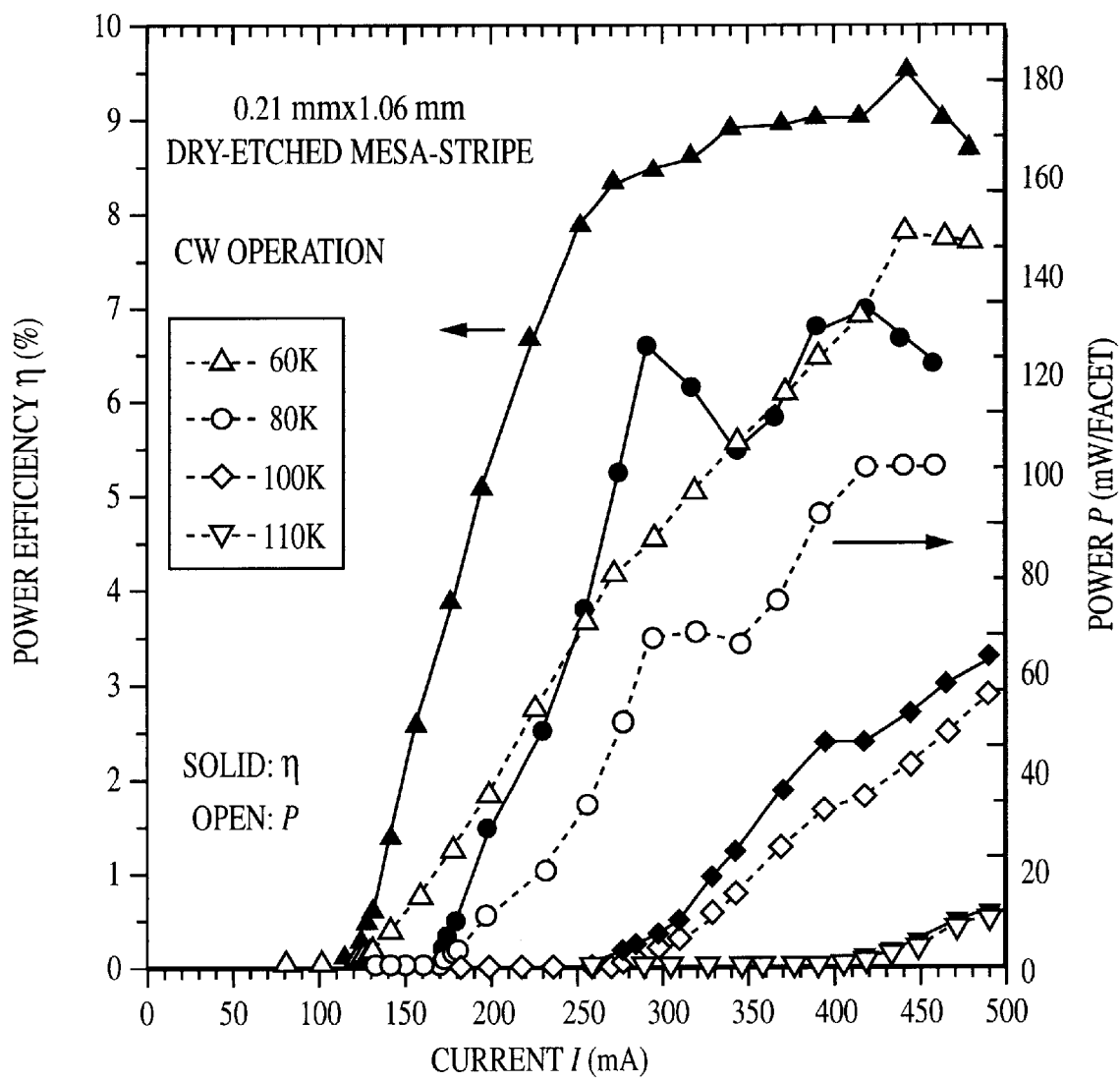
FIG. 4 is a graph illustrating current versus output power and power efficiency of a 0.21-mm-wide and 1.06-mm-long dry-etched mesa-stripe laser of the present invention at several temperatures.
Figure 5:
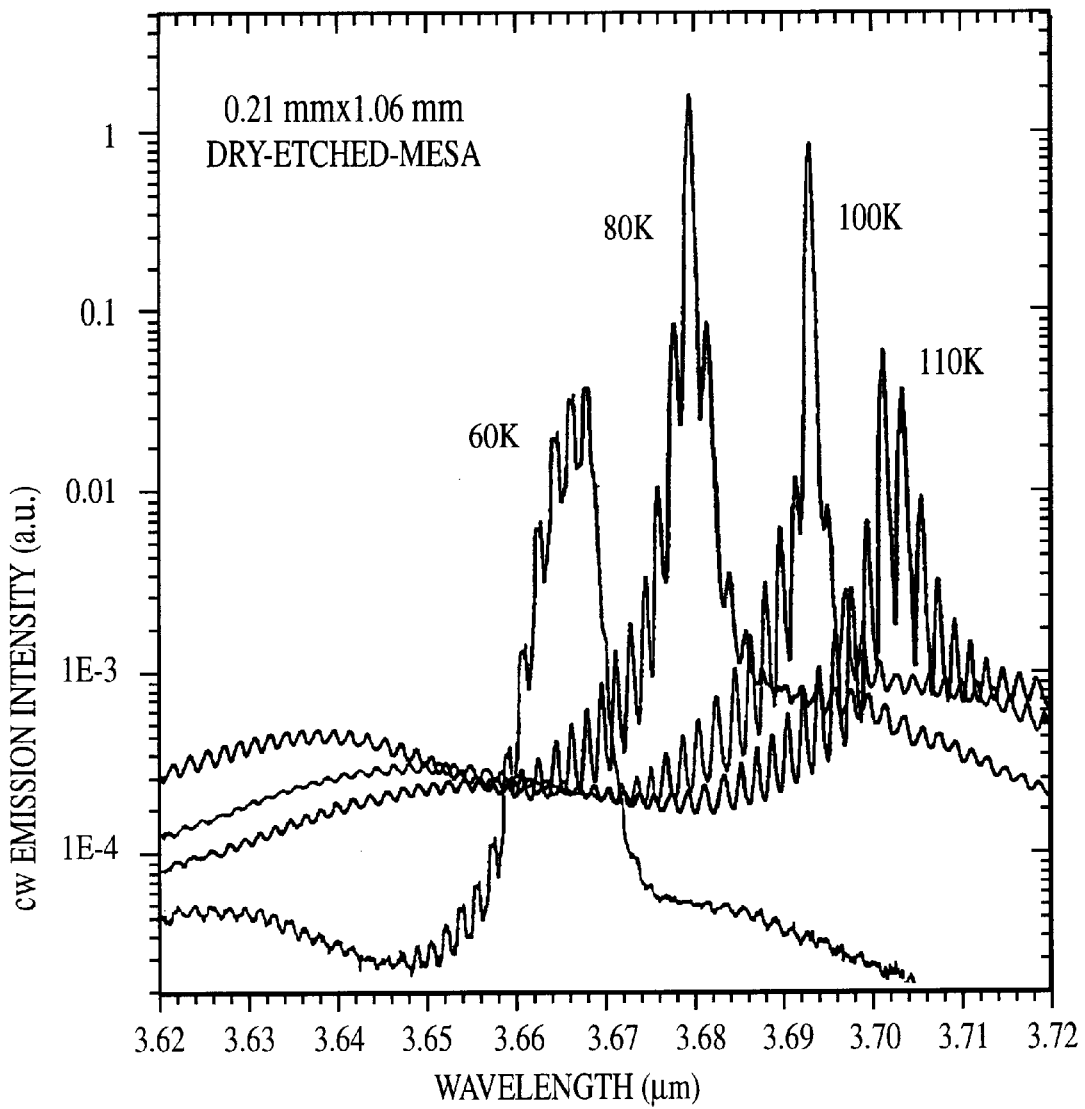
FIG. 5 is a graph illustrating wavelength versus cw emission intensity of a 0.21-mm-wide device shown in FIG. 4 above at several temperatures.
Figure 6:
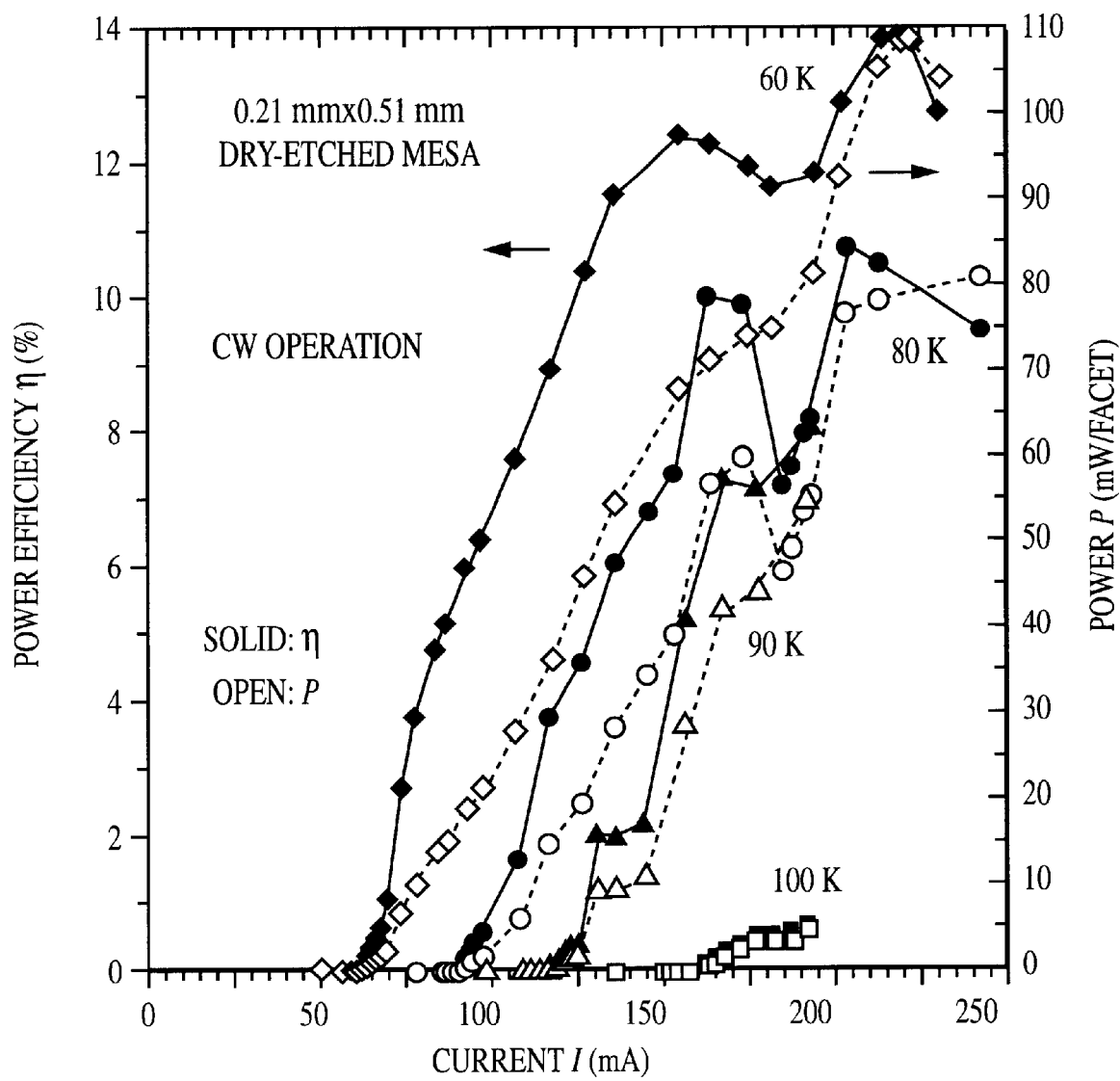
FIG. 6 is a graph illustrating current versus output power and power efficiency of a 0.21-mm-wide and 0.51-mm-long dry-etched mesa-stripe laser of the present invention at several temperatures.

As shown in FIG. 3, an output power of 125 mW/facet was observed from a 0.11-mm-wide and 1.06-mm-long dry-etched mesa-stripe laser of the present invention at 80 K, which is believed to be the highest output power ever recorded from a mid-IR laser under a relatively low current (~460 mA) and with a power efficiency of ~8%. FIG. 4 shows the output power and power efficiency versus current of a 0.21-mm-wide and 1.06-mm-long dry-etched mesa-stripe laser of the present invention at several temperatures. As shown, the maximum cw operation temperature was lowered from 122 K for the 0.11-mm-wide device to 111.5 K for the 0.21-mm-wide device from an increase in heating of the device due to a relatively larger threshold current. FIG. 5 shows the near-threshold lasing spectra, i.e., wavelength versus cw emission intensity, of the 0.21-mm-wide device shown in FIG. 4 at several temperatures, exhibiting a significant red shift of lasing peaks with increasing temperature. Since the DEQE is given by $\eta_e = \eta_i \alpha_m/\alpha_{tot}$, where $\eta_i$ is the internal QE, $\alpha_{tot}$ is the total loss, and $\alpha_m$, is the mirror loss that is inversely proportional to the cavity length, a higher DEQE and power efficiency were observed in a relatively short cavity (0.51-mm) device as shown in FIG. 6. However, due to its higher threshold current density compared to that of other devices (and consequently more heating per area), the maximum cw operation temperature of this device was further lowered to 109.5 K.

Pulsed Operation

Figure 7:
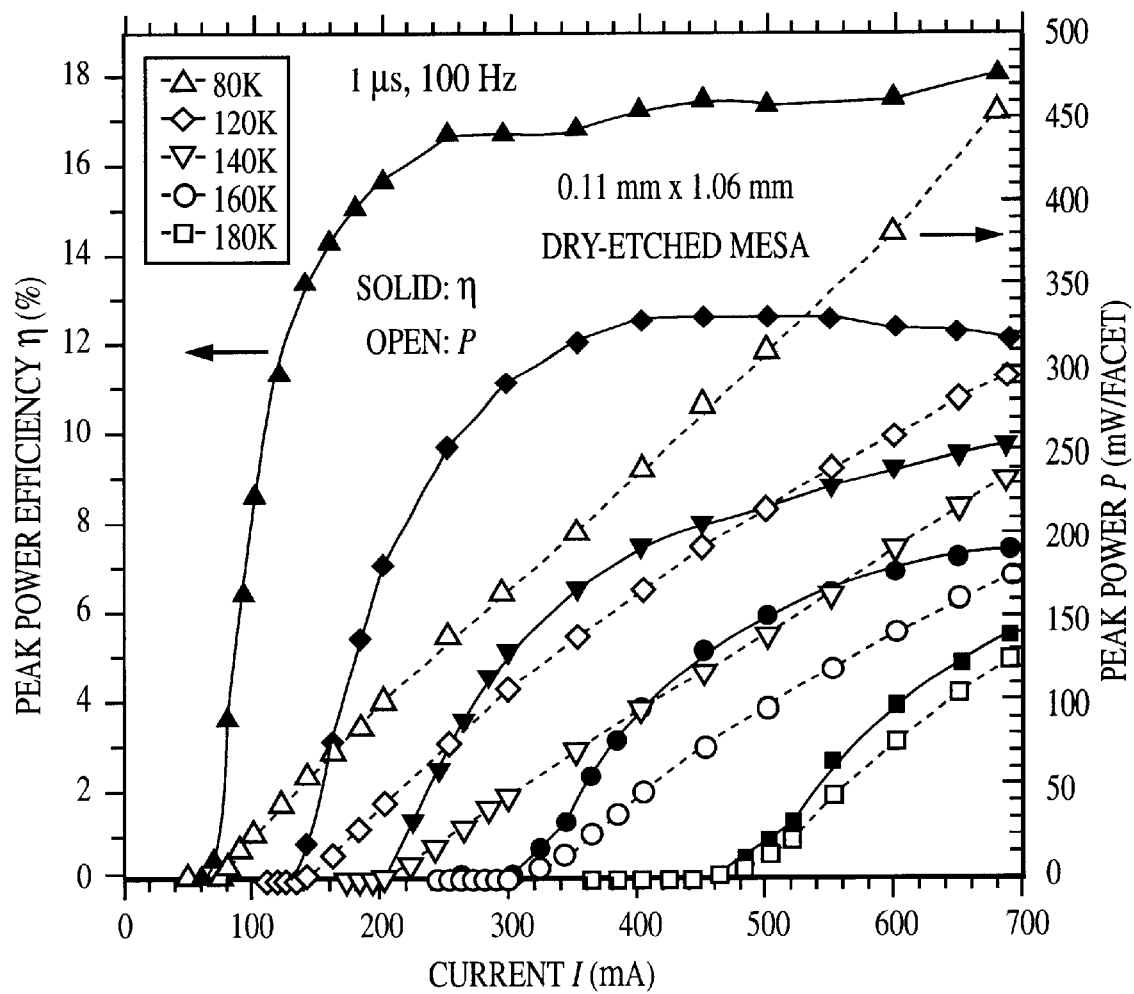
FIG. 7 is a graph illustrating current versus output power and power efficiency of a 0.11-mm-wide and 1.06-mm-long dry-etched mesa-stripe laser of the present invention under 1 $\mu$s current pulses at a repetition rate of 100 Hz.
Figure 8:
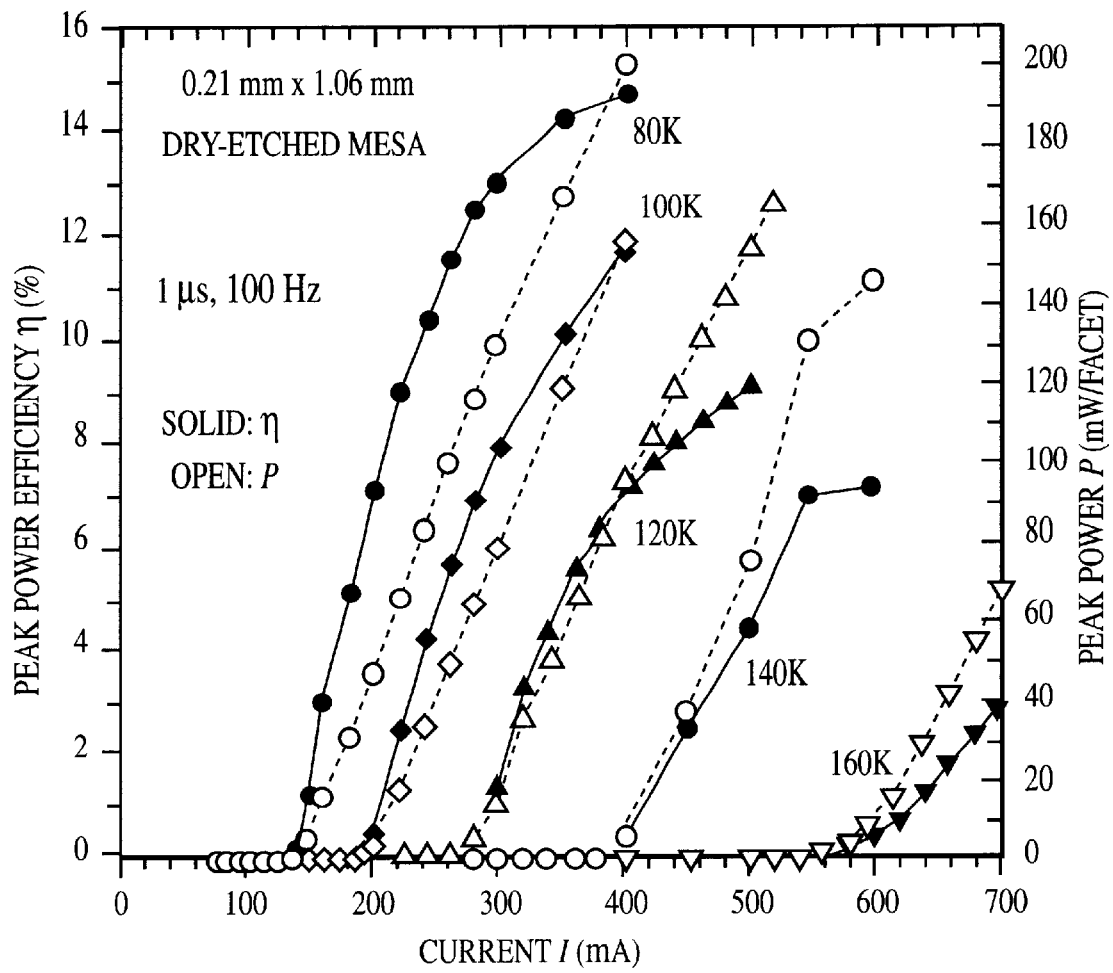
FIG. 8 is a graph illustrating current versus output power and power efficiency of a 0.21-mm-wide and 1.06-mm-long dry-etched mesa-stripe laser of the present invention under 1 $\mu$s current pulses at a repetition rate of 100 Hz.
Figure 9:
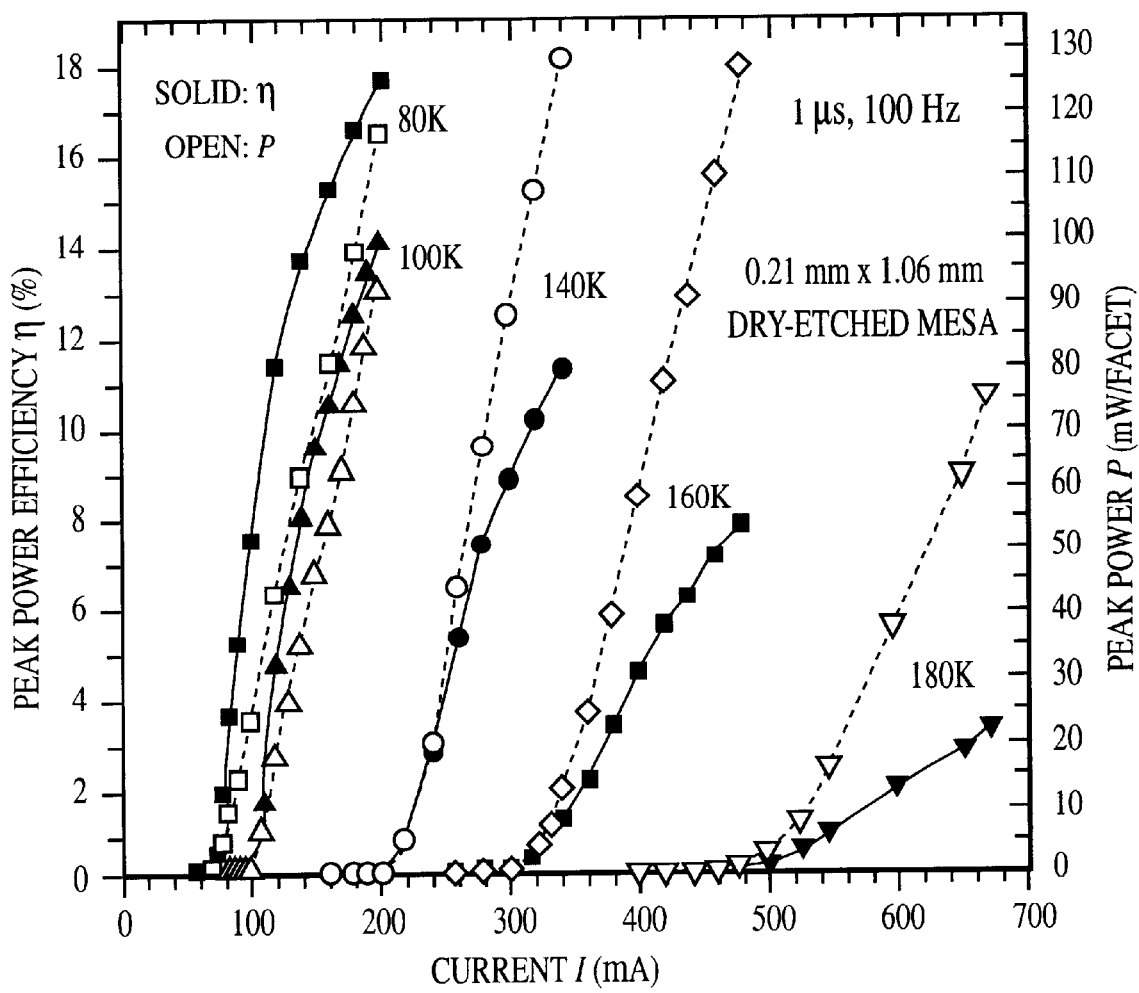
FIG. 9 is a graph illustrating current versus output power and power efficiency of a 0.21-mm-wide and 0.51-mm-long dry-etched mesa-stripe laser of the present invention under 1 $\mu$s current pulses at a repetition rate of 100 Hz.

To evaluate the heating effect as related to device size and to extract the thermal resistance, several of the devices described above were investigated under 1 μs current pulses at a repetition rate of 100 Hz, their peak powers and efficiencies being plotted in FIGS. 7–9 herein. Under such a low duty cycle (0.01%), heating in the device should be negligible. Consequently, significantly higher DEQEs and peak power efficiencies were observed as shown in FIGS. 7–9. Also, their DEQEs and peak power efficiencies at the same current density were relatively insensitive to the mesa-stripe width compared to cw operation. For example, average DEQEs of ~444% and ~473% were obtained for 1.06-mm-long devices at 80 K with stripe widths of 0.11-mm and 0.21-mm, respectively. As expected from the cavity length dependence of the mirror loss, a higher DEQE (~568%) was obtained from the 0.51-mm-long and 0.21-mm-wide devices described above.

Since a peak power efficiency of ~18% was observed from a 1.06-mm-long device at 80 K (FIG. 7), one can speculate that a peak power efficiency of 20% should be achievable in the 0.51-mm-long device (FIG. 9) at 80 K and larger currents. The enhanced performance of these devices in terms DEQEs and peak power efficiencies under pulsed conditions indicate very serious heating of devices under cw operation.

Figure 10:
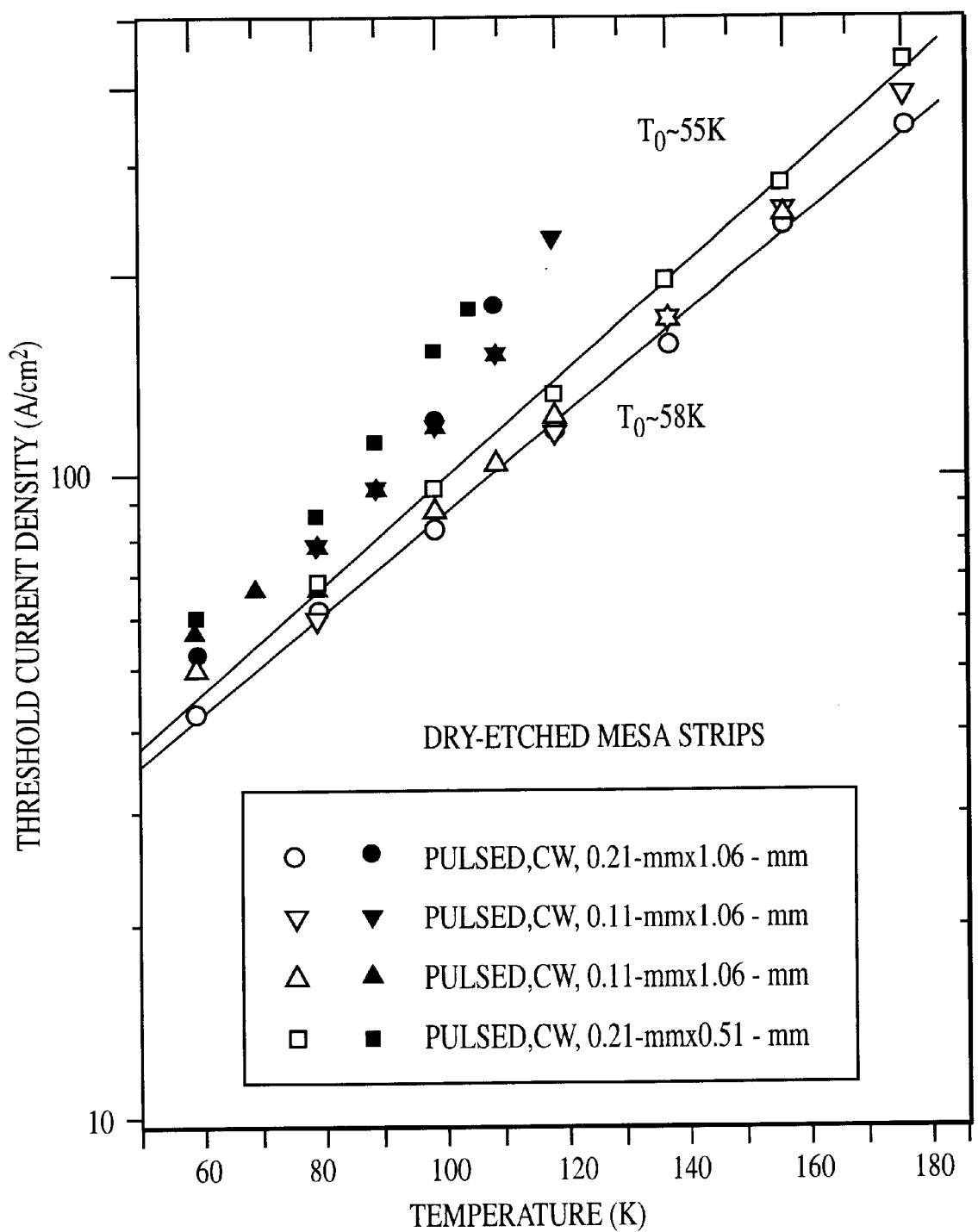
FIG. 10 is graph illustrating the threshold current density versus heat sink temperature for several devices of the present invention under both pulsed and cw conditions.

Thermal Characteristics Of The IC Light Emitting Device Of The Present Invention In FIG. 10, the threshold current density $J_{th}$ is plotted as a function of heat sink temperature $T_h$ for several devices under both pulsed and cw conditions. The pulsed data can be well described in the temperature range from 60 to 180 K by the following exponential formula (1):

$$J_{th} = J_0 exp(T_a/T_0) \qquad (1)$$

with a characteristic temperature $T_0$ in the range of ~55 to 58 K, where the active region temperature is taken as $T_a = T_h$ under pulsed conditions, assuming negligible heating. The $T_0$ values are slightly higher than those of previously reported mesa-stripe IC lasers with a comparable low threshold current density. The cw threshold current densities are substantially higher than their pulsed counterparts and could not be simulated by the exponential formula with a single characteristic $T_0$ in the temperature range of our interest.

Under cw conditions, the active region temperature, which is significantly higher than the heat sink temperature, can be characterized by a thermal resistance $R_{th}$:

$$T_a = T_h + R_{th} V I \qquad (2)$$

Figure 11:
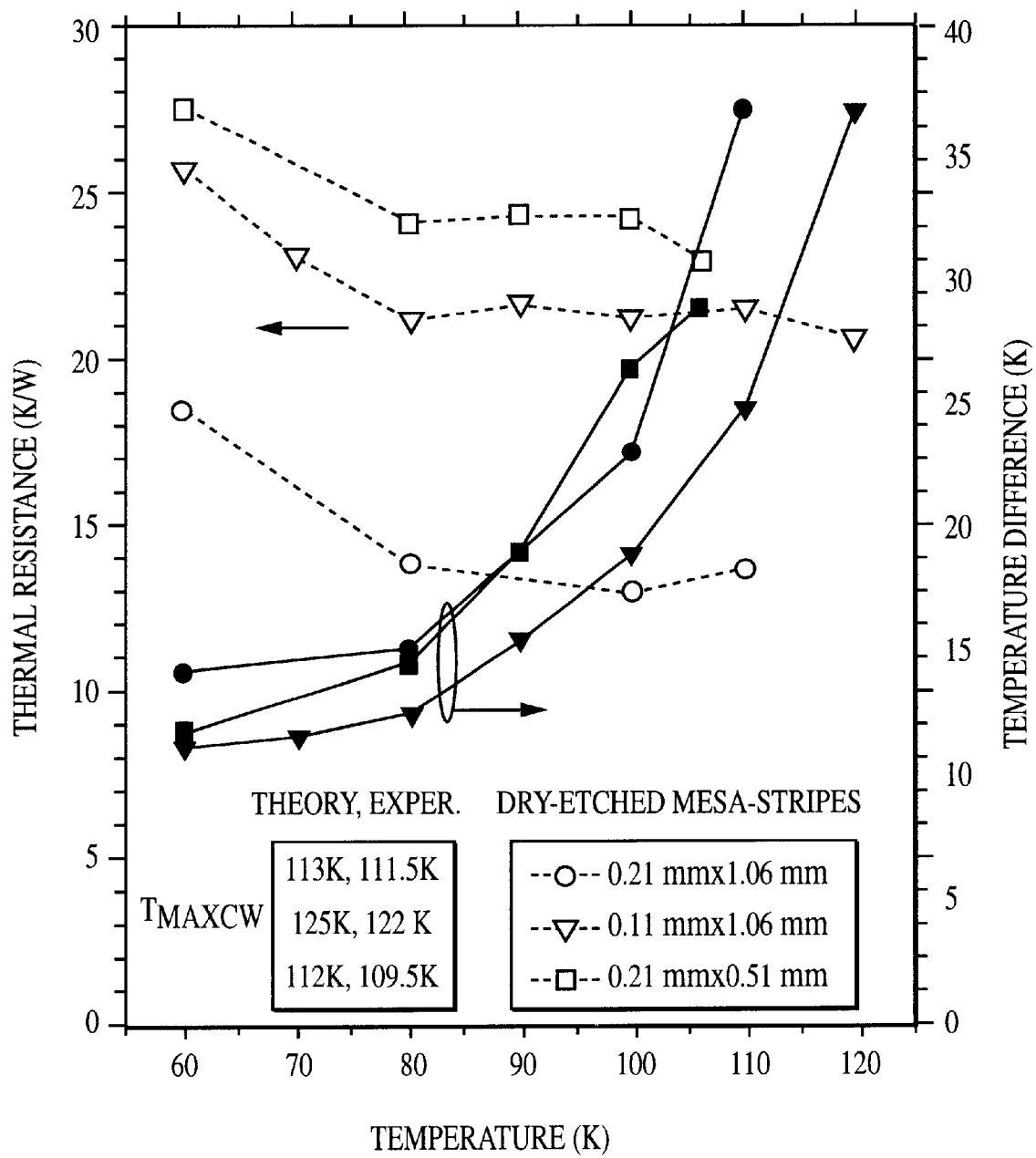
FIG. 11 is a graph illustrating the evaluated temperature dependence of the threshold currents in pulsed and cw conditions of the devices shown in FIG. 10.

Here, $T_a$ is an average over the whole device's active regions under cw conditions because the temperature is no longer uniformly distributed in contrast to the negligible heating conditions in pulsed mode. By comparing the temperature dependence of the threshold currents in pulsed and cw conditions, as shown in FIG. 10, the temperature difference $\Delta T$ (=$T_a - T_h$) and thermal resistance can be evaluated, as shown in FIG. 11. The active region temperature is approximately 10–40 K higher than the heat sink temperature in this operating range; the maximum temperature may be even higher in some regions of the device. A significant temperature gradient throughout the active region of the device can broaden the emission spectrum and possibly increase losses.

From Eqs. (1) and (2), the maximum heat sink temperature $T_{max,cw}$ for cw operation can be estimated according to the following formula (3):

$$T_{max,cw} = T_0[ln(T_0/R_{th}J_0VA)-1], \qquad (3)$$

where A is the active region area, and is obtained as shown in the inset of FIG. 11 in good agreement with the experimental data. By assuming constant internal quantum efficiency, one can also derive that the slope efficiency dP/dI in cw mode is reduced from the pulsed value by the factor $F_{th}$ as determined by the following formula (4):

$$F_{th}=(1-R_{th}I_{th}V/T_0) \quad (4)$$

with dP/dI vanishing at $T_{max,cw}$. Note that $F_{th}$ becomes smaller with increasing current since the threshold current $I_{th}$, determined by Eqs. (1) and (2), is associated with the actual device temperature and operating current, limiting the attainable output power.

As described in Eqs. (2)–(4) above, $R_{th}$ represents the detrimental effects of heating on laser performance. As shown in FIG. 11, $R_{th}$ ranges from ~13 to 27 K/W, which is very high for broad-area lasers. These values correspond to specific thermal resistance of about 24–29 K*cm²/kW, which are much higher than values reported for narrow-stripe intersubband QC lasers (~2–2.4 K*cm²/kW epi-side-up, ~0.33–0.9 K*cm²/kW epi-side-down) and for epi-side-down mounted broad-area type-II QW mid-IR lasers (2 K *cm²/kW for optical pumping, 8–9.2 K*cm²/kW for diodes). The high thermal resistance in these IC lasers could be due partially to low thermal conductivity of InAs/AlSb superlattice cladding layers and might also be attributed largely to non-optimum device package/inhomogeneous bonding over a large area of the laser bar (~8 mm×0.5–1 mm). The inventors of the present invention unexpectedly discovered that one way to reduce this undesirable heating is to make small-area ridge lasers with thermal conducting fillings between the ridges.

Figure 12:
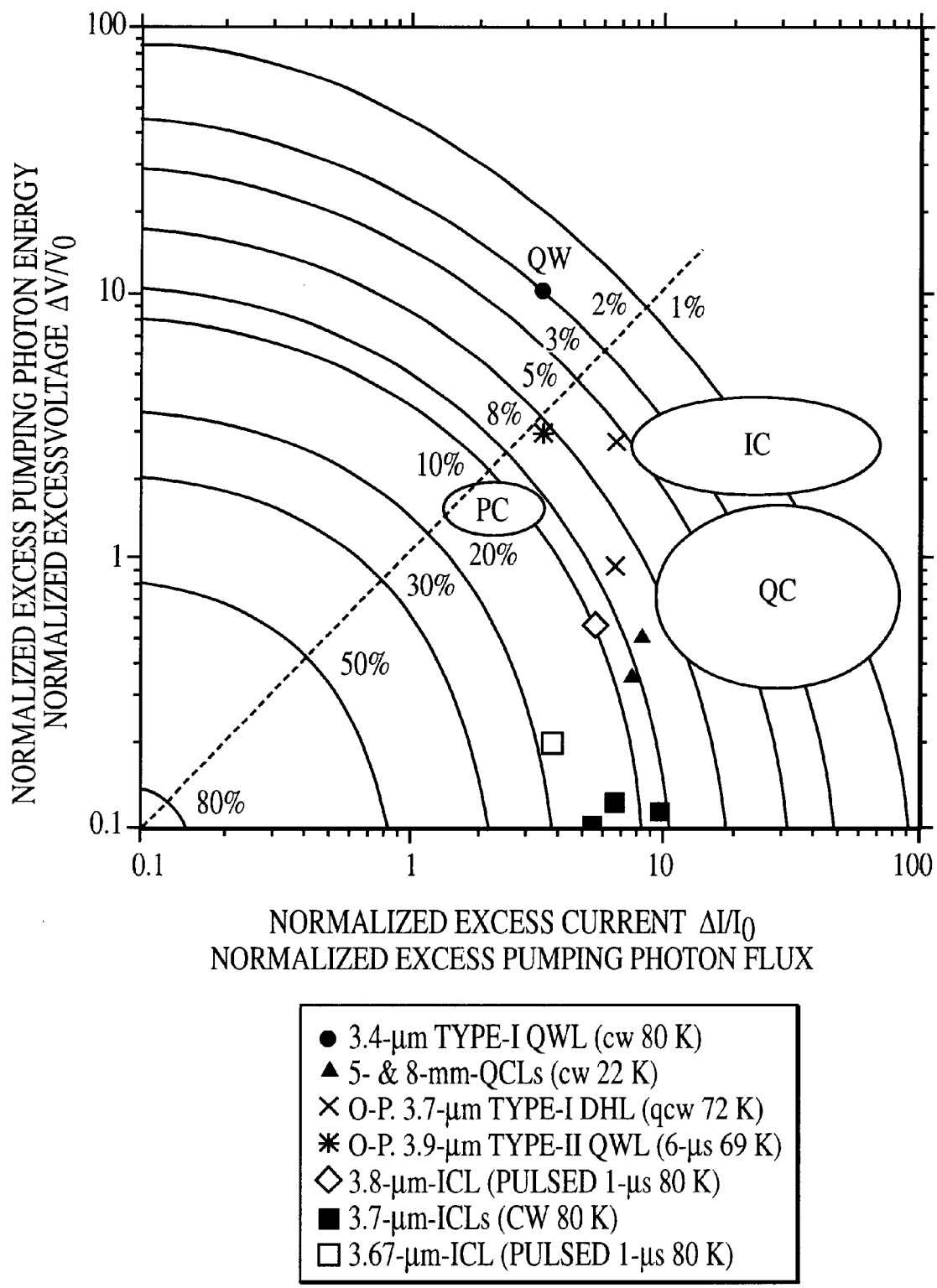
FIG. 12 is a graph illustrating the normalized excess current versus the normalized excess voltage of several IC light emitting devices of the present invention compared to previous QC and IC lasers.

In another aspect of the present invention, the inventors discovered that mounting the IC light emitting device epilayer side down also efficiently reduces heat accumulation in the active region To further assess the power efficiency of mid-IR lasers, contours of constant power efficiency in terms of normalized excess current $\Delta I/I_0$ and voltage $\Delta V/V_0$ are shown in FIG. 12. Here, the excess voltage $\Delta V$ ($=V-V_0$) is the difference between the applied voltage V and the minimal voltage $V_0(=N_e*E_p/e)$ required in an ideal case. The excess current is $\Delta I=I-I_0$, where $I_0$ is the minimal injection current required for a desired output power $P_o$ and is determined by the following formula (5):

$$I_0=P_o/V_0=eP_o/(N_cE_p) \quad (5)$$

As shown in FIG. 12, the normalized excess current $\Delta I/I_0$ and voltage $\Delta V/V_0$ hold an equal position in determination of the power efficiency. In FIG. 12, some data points for IC lasers of the present invention are plotted, as well as other types including the optically pumped lasers that can also be described by the contours if the formalized excess-pumping photon flux and excess-pumping photon energy $\Delta E_{pump}/E_p$ are used. The shaded areas (QC, IC, PC) are estimates and for QC, IC, and projected optimized cascade lasers, respectively, operating at temperatures above 77 K.

As can be seen from FIG. 12, the normalized excess voltage $\Delta V/V_0$ is small (e.g. ~0.1–0.6) in cascade configurations of the present invention, indicative of a very efficient use of applied bias voltage. This efficient use of applied bias voltage results in considerably higher power efficiencies in contrast to conventional mid-IR diode lasers. It is believed that this higher power efficiency is attributable to reduction of the threshold current density and to minimization of the excess voltage at the threshold so that the differential resistance, although larger than measured in intersubband QC lasers and in some conventional diode lasers, becomes less of a concern for power dissipation.

The resulting power efficiency is the highest among mid-IR lasers with output power in the vicinity of 100 mW/facet for cw mode and of 500 mW/facet for pulsed mode. At this performance level, it is believed that the IC light emitting devices of the present invention meet the basic requirements for the IRCM application in terms of output power and efficiency if a diode array is fabricated with improved device packaging and thermal management. Furthermore, with improvement in material quality, device design, and fabrication/packaging for IC lasers, it is very likely that threshold current densities can be further reduced so that the power efficiency can exceed 20% and perhaps reach 30% with a cw output power of ~0.5 W from a single diode at temperatures above 77 K.

Thus, the IC light emitting devices of the present invention, and the method of fabrication thereof, enable production of an IC laser having record-high wall-plug efficiencies in both cw and pulsed mode, high cw output powers at relatively low currents and relatively high temperatures. Furthermore, it is believed that the threshold current densities of the IC lasers of the present invention can be lowered by improvements in material quality, device design, and fabrication/packaging such that power efficiencies can exceed 30% with a cw output power of ~0.5 W or greater from a single diode at temperatures exceeding 77 K.

What is claimed is:

1. A method of manufacturing an interband cascade light-emitting device comprising the steps of:
    (a) growing a laser sample made from Al(In)Sb, InAs, and Ga(In)Sb layers having a top, bottom and cavity in a solid source molecular beam epitaxy (MBE) system on a (001)-oriented p-type GaSb substrate;
    (b) processing said laser sample into mesa-stripes having widths of from 35–215 μm and about 500 μm center-to-center separations between mesas using etching to form an etched sample;
    (c) deposition of an about 250 μm thick SiO₂ layer on said etched sample;
    (d) removal of the 250 μm thick SiO₂ layer on top of said mesas to allow deposition of metal contacts to top device layers;
    (e) deposition of Au/Ni/AuGe metal contact layers having a thickness of about 300 μm and a width of about 250 μm on the top of said sample to form a contact or bonding pad;
    (f) lapping and polishing of the bottom of said laser sample down to about 100 μm.
    (g) deposition of a Ti/Au metal contact layer having a thickness of about 350 μm on the bottom of said sample;
    (h) cleavage of one or more laser bars having an epilayer and both facets left uncoated to said cavity of said sample;
    (i) mounting of said laser bars, epilayer side up, onto a second substrate to form said device.

2. A method of manufacturing an interband cascade light emitting device comprising:
    (a) growing a laser sample having a top, bottom and cavity in a solid source molecular beam epitaxy (MBE) system on a (001)-oriented p-type GaSb substrate;
    (b) processing said laser sample into mesa-stripes having widths of from 35–215 μm and about 500 μm center-to-center separations between mesas using etching to form an etched sample;
    (c) deposition of an about 250 μm thick SiO₂ layer on said etched sample;
    (d) removal of the 250 μm thick SiO₂ layer on top of said mesas to allow deposition of metal contacts to top device layers;

(e) deposition of Au/Ni/AuGe metal contact layers having a thickness of about 300 μm and a width of about 250 μm on the top of said sample to form a contact or bonding pad;

(f) lapping and polishing of the bottom of said sample down to about 100 μm;

(g) deposition of a Ti/Au metal contact layer having a thickness of about 350 μm on the bottom of said sample;

(h) cleavage of one or more laser bars having an epilayer and both facets left uncoated to said cavity of said sample;

(i) mounting of said laser bars, epilayer side up, onto a second substrate, wherein said interband cascade light emitting device is comprised of 18 active regions separated by n-type injection regions and multiple coupled quantum wells of Al(In)Sb, InAs, and Ga(In)Sb layers and has a differential external quantum efficiency of at least 500%, a peak power output of at least 4W/facet, a power conversion efficiency of at least 14% in continuous wave at 80K, a power conversion efficiency of at least 18% in pulsed wave operation at 80K, a continuous wave operation temperature of 142 K or less, a thermal resistance of from about 24–29 K *cm$^2$/kW and continuous wave output powers of at least 100 mW/facet at temperatures above 77 K.

3. The method of claim 1, wherein said etching comprises wet chemical etching and dry-etching techniques.

4. The method of claim 2, wherein a method of deposition (c) of a 250 μm thick layer of SiO$_2$ on the etched sample comprises plasma enhanced chemical vapor deposition.

5. The method of claim 3, wherein said methods of deposition (d) of Au/Ni/AuGe comprise photolithography and lift-off techniques.

6. The method of claim 4, wherein the second substrate is comprised of a metal.

7. The method of claim 4, wherein the second substrate is a metal sheet.

8. The method of claim 7, wherein said metal sheet is a thin copper sheet.

9. A method of manufacturing an interband cascade light-emitting device comprising the steps of:

(a) growing a laser sample made from Al(In)Sb, InAs, and Ga(In)Sb layers having a top, bottom and cavity;

(b) processing said laser sample into mesa-stripes having widths of from 35–215 μm and about 500 μm center-to-center separations between mesas using etching to form an etched sample;

(c) deposition of an about 250 μm thick SiO$_2$ layer on said etched sample;

(d) removal of the 250 μm thick SiO$_2$ layer on top of said mesas to allow deposition of metal contacts to top device layers;

(e) deposition of Au/Ni/AuGe metal contact layers having a thickness of about 300 μm and a width of about 250 μm on the top of said sample to form a contact or bonding pad;

(f) lapping and polishing of the bottom of said laser sample down to about 100 μm;

(g) deposition of a Ti/Au metal contact layer having a thickness of about 350 μm on the bottom of said sample;

(h) cleavage of one or more laser bars having an epilayer and both facets left uncoated to said cavity of said sample;

(i) mounting of said laser bars, epilayer side up, onto a second substrate to form said device.

* * * * *